(12) United States Patent
Wu

(10) Patent No.: US 7,166,868 B2
(45) Date of Patent: *Jan. 23, 2007

(54) SOLDERLESS CONNECTION IN LED MODULE

(76) Inventor: Jiahn-Chang Wu, 15, Lane 13, Alley 439, Her-Chiang Street, Chu-Tung, Hsinchu (TW)

( * ) Notice: Subject to any disclaimer, the term of this patent is extended or adjusted under 35 U.S.C. 154(b) by 117 days.

This patent is subject to a terminal disclaimer.

(21) Appl. No.: 11/041,535

(22) Filed: Jan. 25, 2005

(65) Prior Publication Data

US 2005/0146028 A1    Jul. 7, 2005

Related U.S. Application Data

(63) Continuation of application No. 10/436,748, filed on May 14, 2003, now Pat. No. 6,911,731.

(51) Int. Cl.
*H01L 27/15* (2006.01)
(52) U.S. Cl. .............................. 257/81; 257/79; 257/84; 257/98; 257/99; 257/433; 257/434; 257/704
(58) Field of Classification Search ............................ None
See application file for complete search history.

(56) References Cited

U.S. PATENT DOCUMENTS 5,329,437 A * 7/1994 Briggs .................. 362/393
5,617,131 A * 4/1997 Murano et al. ............. 347/233
6,583,444 B1 * 6/2003 Fjelstad ......................... 257/82
6,911,731 B1 * 6/2005 Wu ............................. 257/727

* cited by examiner

*Primary Examiner*—Wai-Sing Louie
(74) *Attorney, Agent, or Firm*—H. C. Lin

(57) ABSTRACT

The electrodes of a light emitting diode (LED) is coupled to the terminals of a package with solderless pressure contacts. Each package is housed in a module with a bed on which the bottom electrode of the LED rests, and a pressure plate which is coupled to the top electrode of the LED. The pressure plate slides along four vertical posts to exert pressure to an LED package against a bed to form solderless pressure contacts. A plurality of LED packages can be lined up in a row to form a light strip, with the top pressure plate extended to form the bed of an adjacent module. A plurality of LED packages can also be arranged a matrix array display panel, where a plurality of lower terminals rests on one row of common bed of a number of parallel horizontal common beds, and where a plurality of upper terminals are pressed under a column of parallel vertical common pressure plates, so that any individual LED at the cross-point of a common bed and a common pressure can be randomly accessed.

9 Claims, 11 Drawing Sheets

SOLDERLESS CONNECTION IN LED MODULE

This application is a continuation of application Ser. No. 10/436,748, filed May 14, 2003, now U.S. Pat. No. 6,911,731.

BACKGROUND OF THE INVENTION

1. Field of the Invention

This invention relates to light emitting diodes (LED), particularly to a module for housing LED package.

2. Brief Description of Related Art

FIG. 1 shows a prior art for mounting LEDs, such as LED 11, on a display panel. The LED 11 is mounted on a substrate 10, which is lined with printed circuits 101, 102. The top electrode of the LED 11 is wire bonded to circuit 101 with solder and the bottom electrode of LED 11 is soldered to the circuit 102. The drawback of such a LED panel is poor heat removal, degrading light illumination efficiency. Another drawback is the complicated process of soldering the wire to the printed circuit and the maintenance thereof.

SUMMARY OF THE INVENTION

An object of this invention is to improve the heat removal of a light emitting diode display panel. Another object of this invention is to eliminate soldering the LEDs to the panel, thereby avoiding the complicated process and maintenance.

These objects are achieved by using pressure contact to attach the LEDs to a package. Each LED is mounted in a package with solderless pressure contacts between the LED electrodes and the terminals of the package. These packages are housed in a module with a flat bed and a pressure plate. When the top pressure plate is clamped, solderless pressure contacts between the LED electrodes and the terminals are formed.

DETAILED DESCRIPTION OF THE INVENTION

Figure 1:
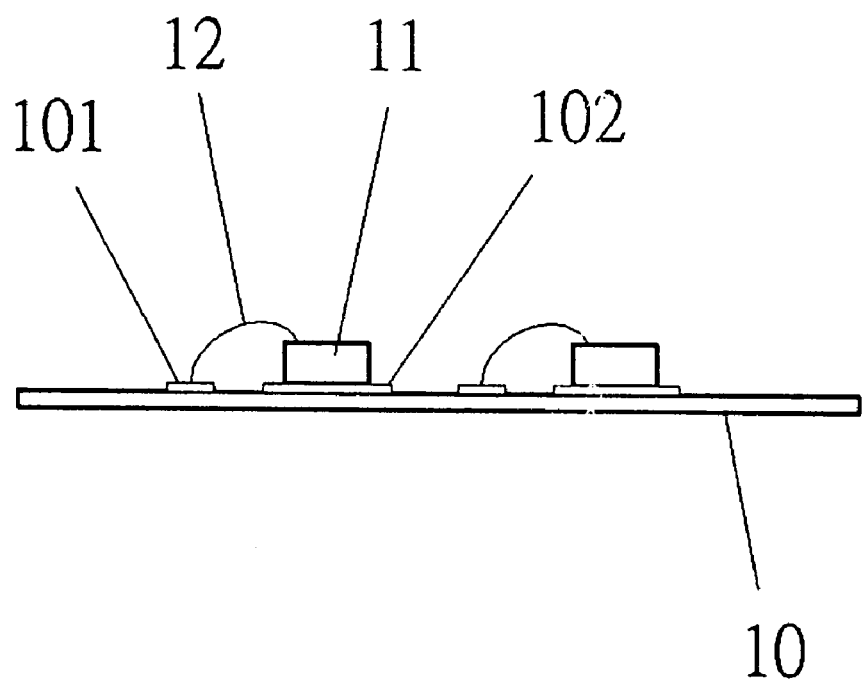
FIG. 1 shows a prior art LED display panel using soldering contacts.
Figure 2A:
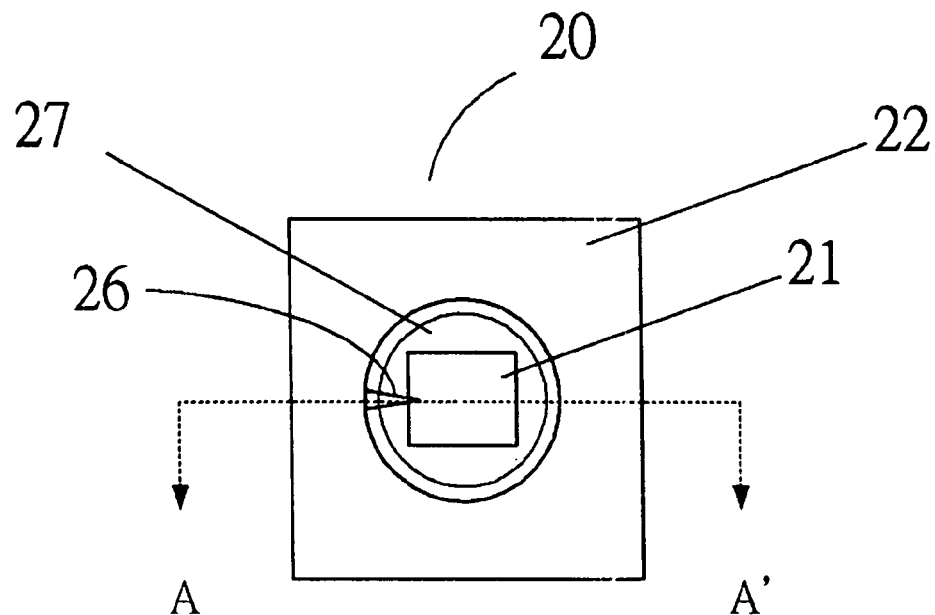
FIG. 2A shows the top view of the basic structure of an LED package based on the present invention.
Figure 2B:
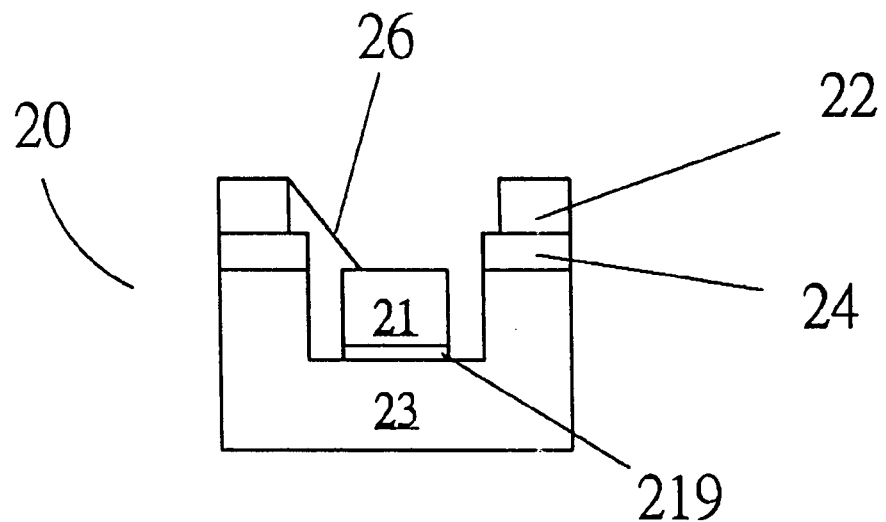
FIG. 2B shows the side view of the LED package shown in FIG. 2A.

FIG. 2A shows the top view of a light emitting diode package 20. The LED has a bottom electrode mounted by conductive glue 219 on the recess of a metal substrate 23 serving as a first terminal of the LED 21. An insulating washer 24 is placed over the substrate, as shown in the cross-sectional view FIG. 2B of the package 20. The top electrode of the LED 21 is connected by metal strip or wire 26 to the top of the metal plate 22. Over the washer 24 is a hollow metal plate 22 covering over the end of the wire 26, serving as the second terminal of the of the LED 21. The hollow upper terminal 22 allows the light emitted from the LED 21 to transmit.

Figure 3A:
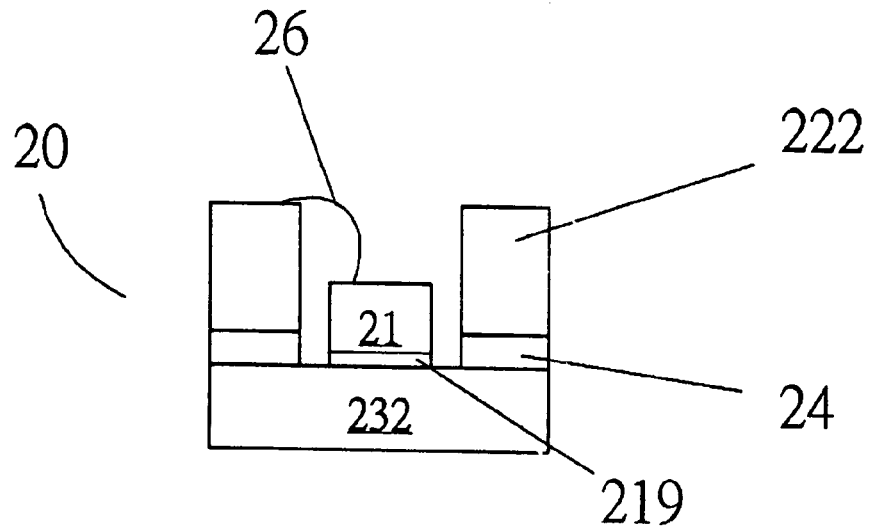
FIG. 3A shows a second embodiment of the LED package.

FIG. 3A shows a second version of the package 20 for an LED 21. Similar to FIG. 2B, the LED 21 is mounted on a substrate 232 serving as a lower terminal, and the substrate 232 is insulated by a washer 24 from the hollow upper cover 222, serving as an upper terminal. However, the wire 26 connected to the top electrode of the LED 21 terminates over the shoulder of the upper terminal 222.

Figure 3B:
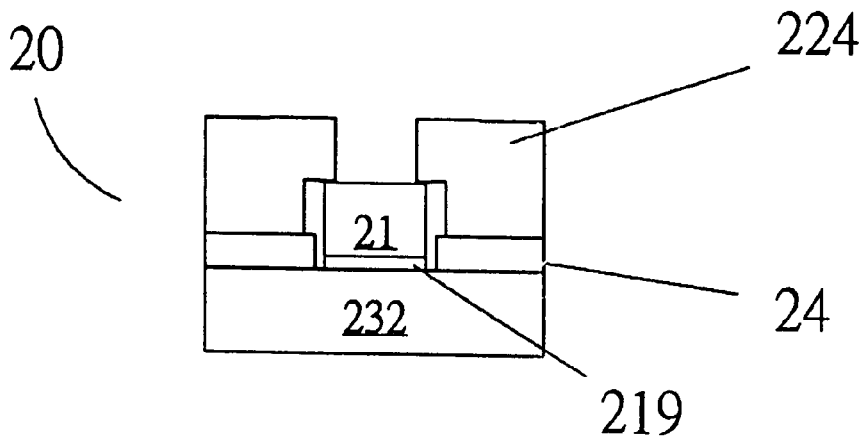
FIG. 3B shows a third embodiment of the LED package.

FIG. 3B shows a third embodiment of the LED package 20. The structure is of the package 20 for LED 21 is similar to that in FIG. 3A with corresponding substrate 232 and insulating washer 24. However, the hole of the hollow upper terminal 224 is smaller that the top surface of the LED so that the inner shoulder of the upper terminal 224 lies over the rim of the LED 21, thus making contact to the top electrode of the LED 21 without using a wire.

Figure 4A:
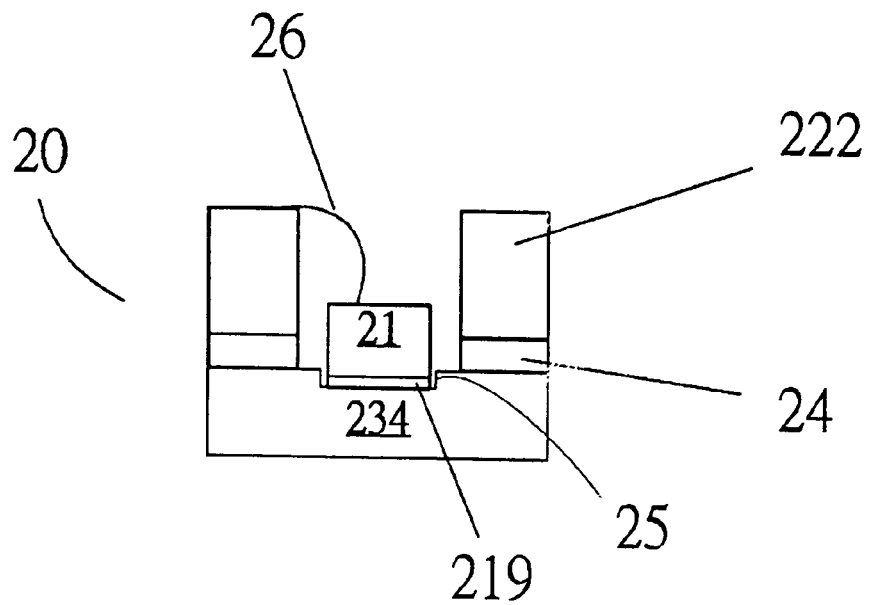
FIG. 4A shows a fourth embodiment of the LED package.

FIG. 4A shows a fourth embodiment of the LED package 20. The structure is similar to that shown in FIG. 3A with corresponding reference numerals. The only difference is that the substrate or the lower terminal 234 is recessed and the LED 21 is anchored in the recess 25.

Figure 4B:
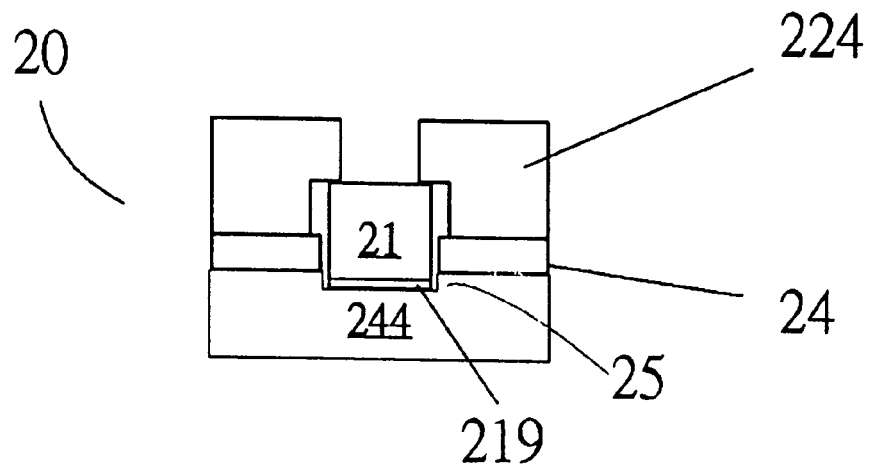
FIG. 4B shows a fifth embodiment of the LED package.

FIG. 4B shows a fourth embodiment of the LED package 20. The structure is similar to that shown in FIG. 3B with corresponding reference numerals. The only difference is that the substrate or lower terminal 244 is recessed and the LED 21 is anchored in the recess 25.

Figure 5:
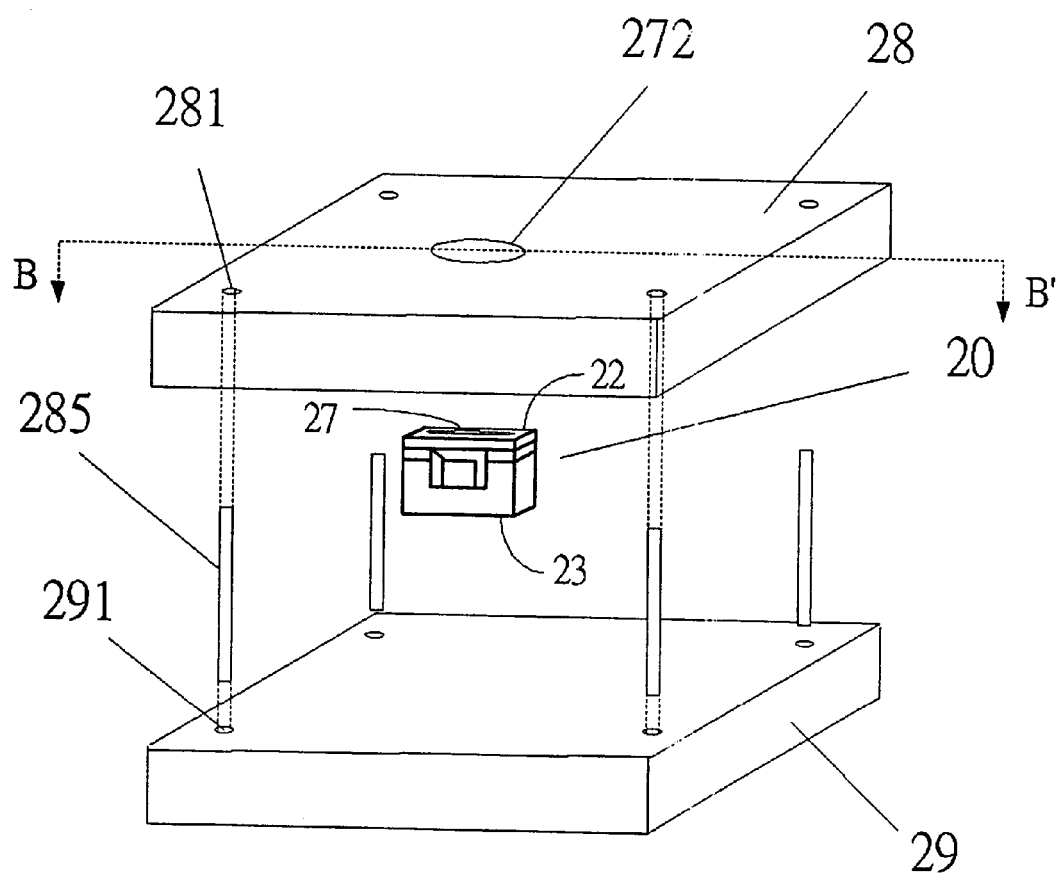
FIG. 5 shows a basic structure of a module for housing a LED package between a pressure plate and a flat bed.

FIG. 5 shows the basic structure of a module for housing a LED package. The module has a flat bed 29 on which the lower terminal 23 of an LED package rests, and a top pressure plate 28, which has a window 272 for the emitted light to transmit through the hole 27 of the upper terminal 22 of the LED package 20. The bed 29 is inserted with four vertical expandable telescopic posts 285 at its corners 291. The upper ends 281 of the posts are attached to four corners of the top pressure plate 28 so that the top pressure plate can slide along the vertical posts like an elevator.

Figure 6:
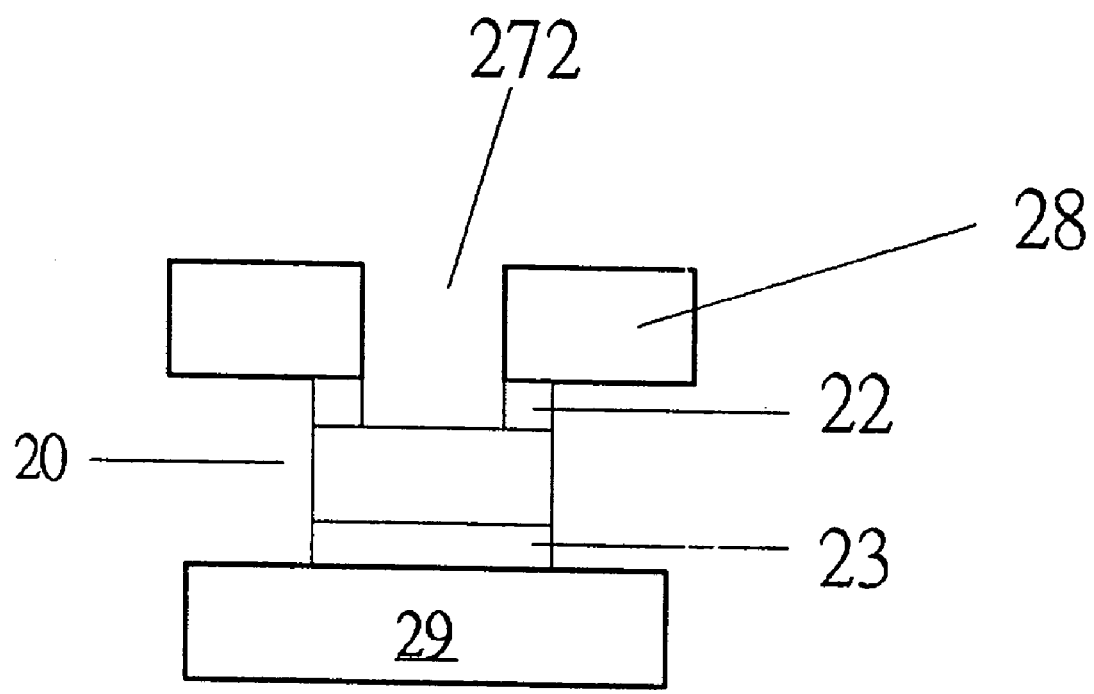
FIG. 6 shows a first version of a pressure plate pressing against an LED package.

FIG. 6 shows the LED package 20 in the module shown in FIG. 5 being compressed by the top pressure plate 28 when the top pressure plate 28 is lowered. The bottom terminal 23 of the LED package 20 (of the type shown in FIG. 2B for instance) is pressed against the bed 29 of the module. The upper terminal 22 of the LED package 20 is compressed by the top pressure plate 28 with the window 272 of the top pressure plate aligned with the LED package 20, so that the emitted light from the LED package 20 can pass.

Figure 7A:
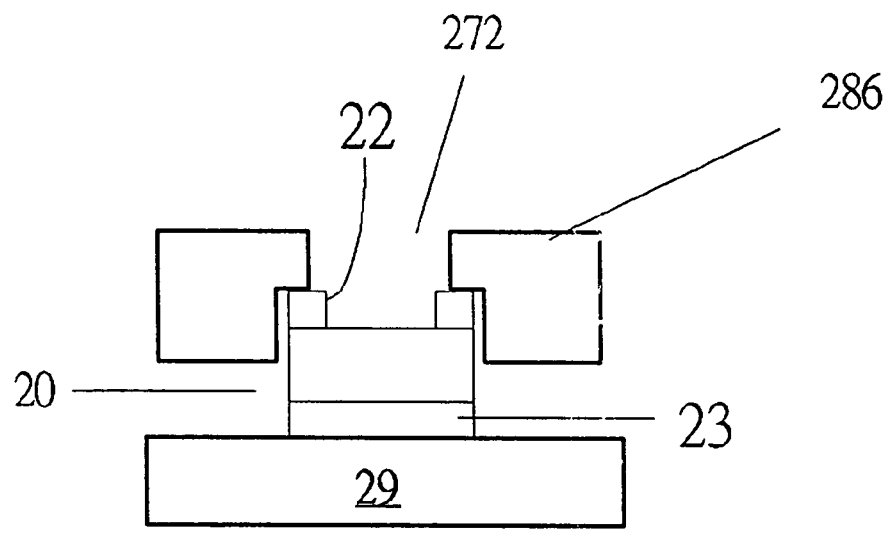
FIG. 7A shows a second version of a pressure plate pressing against an LED package.

FIG. 7A shows a second version of the top pressure plate 286 which has a recess. When this angled top pressure plate is lowered to compress an LED package 20, the pressure plate 286 caps over and anchors the LED package 20. The LED package 20 shown is of the type shown in FIG. 2B for instance. When the top pressure plate 286 is compressed, the lower terminal 23 of the LED package makes intimate solderless contact with the bottom metal bed 29, and the upper terminal 22 of the LED package makes intimate solderless contact with the top pressure plate 286. Between the pressure plate 286 and the bottom plate 29 is an air-gap.

Figure 7B:
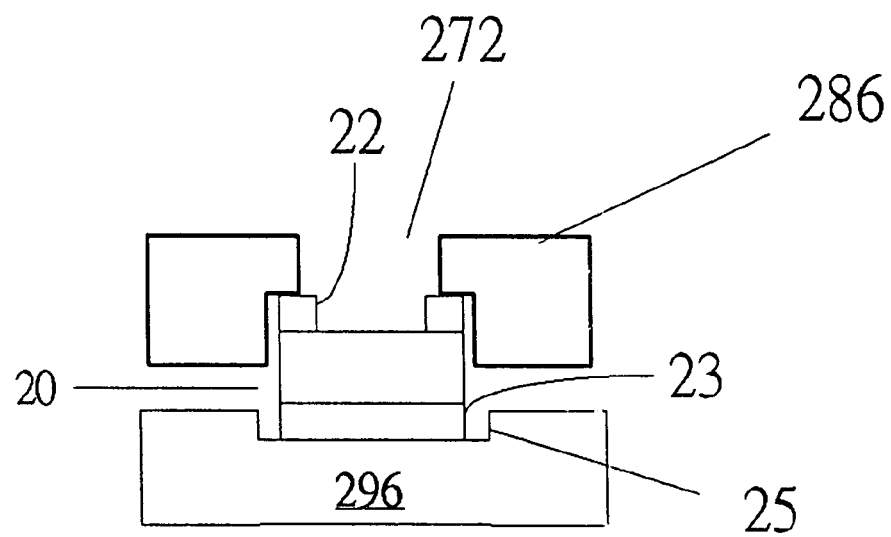
FIG. 7B shows a third version of a pressure plate pressing against an LED package anchored in a recess.

FIG. 7B shows a third version of the LED module. The structure is similar to that shown in FIG. 7a with corresponding reference numerals except the bottom metal bed 296, which has a recess 25 to anchor the LED package 20.

Figure 8A:
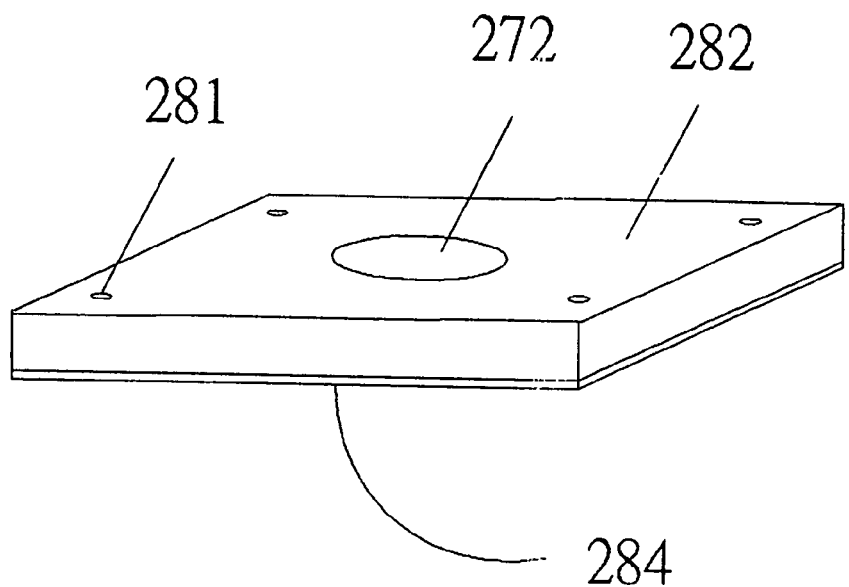
FIG. 8A shows fourth version of the pressure plate of the LED package.

FIG. 8A shows a second version of a top pressure plate 282 which is of insulating material. Otherwise, the structure is similar to that shown in FIG. 5 with corresponding reference numerals 281 for the ends of the vertical posts and 272 for the window. Since the top plate 282 is of insulating material, the bottom surface of the 282 top pressure plate is coated with conducting material 284 to provide electrical contact for the upper terminal of the LED package.

Figure 8B:
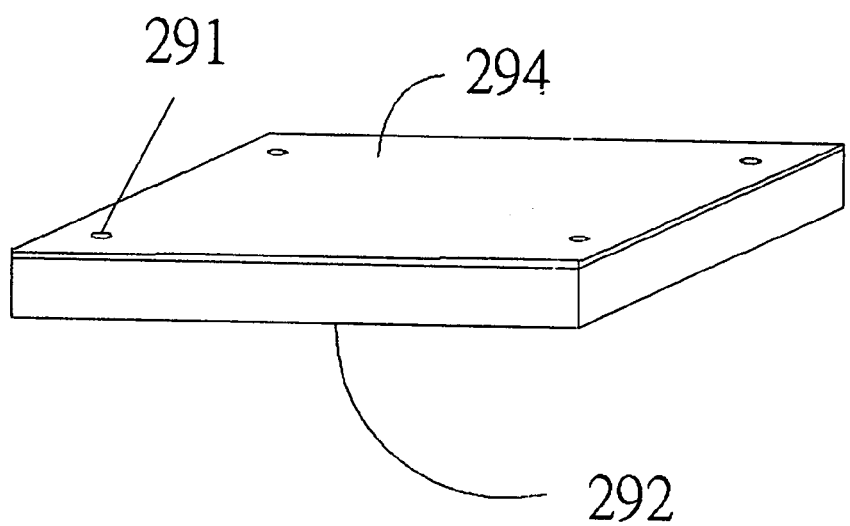
FIG. 8B shows a fifth version of the pressure plate.

Similarly in FIG. 8B, the lower bed 292 can be of insulating material such as a printed circuit board. In such a case, the top surface of the bed 292 is coated with a conducting layer 294 so that the lower terminal of the LED is in electrical contact with an external circuit.

Figure 9:
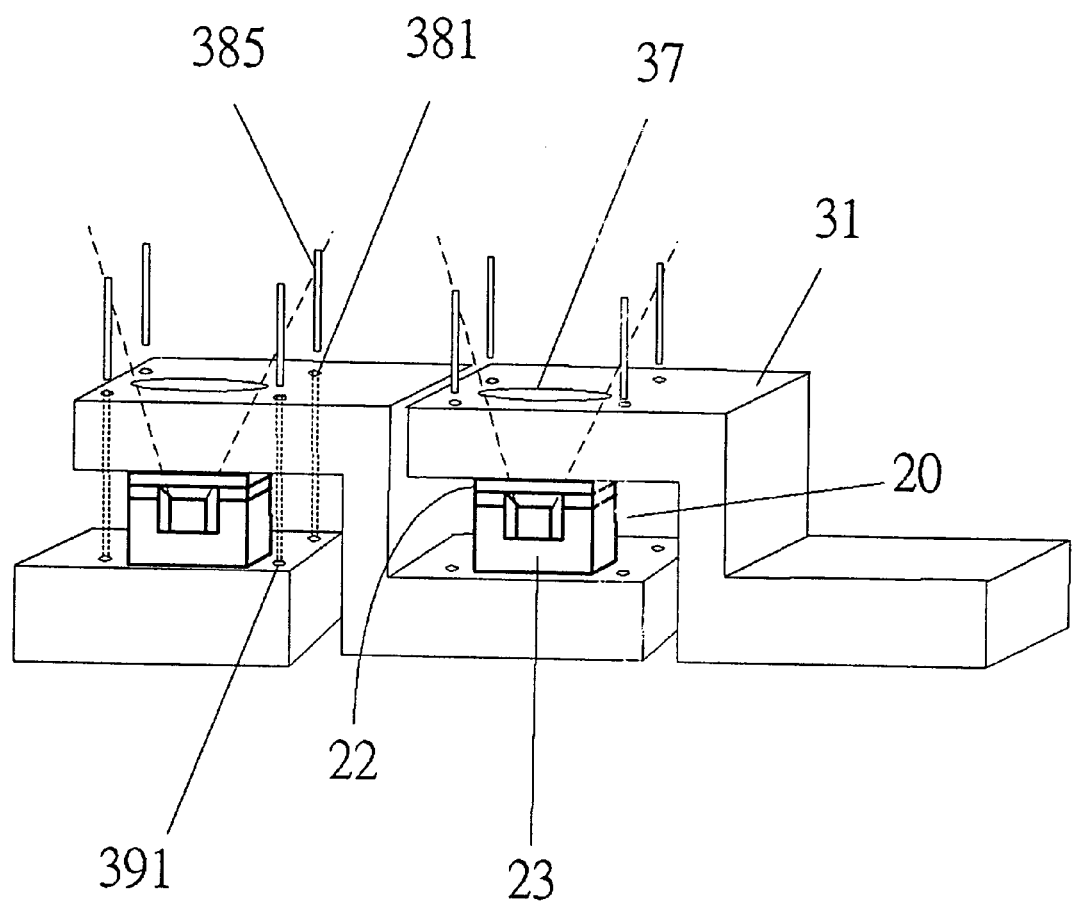
FIG. 9 shows a multiple LED modules connected in series to form a lighting strip.

FIG. 9 shows a second embodiment of the LED module for a light strip. A plurality of LED modules are lined up in a row. The top plate of the 31 is of Z-shape and is extended to become the bed of an adjacent module. In each module, the lower terminal 23 of an LED package 20 is pressed on a bed to make a solderless contact, and the upper terminal 22 is pressed to make solderless contact with the top pressure plate 31 by aligning the window 37 with the LED package 20 and sliding the holes 381 of the top plate 37 along the vertical posts 385 inserted in the holes 391 in the beds. In so doing, the LED packages in the same row are connected in series.

Figure 10:
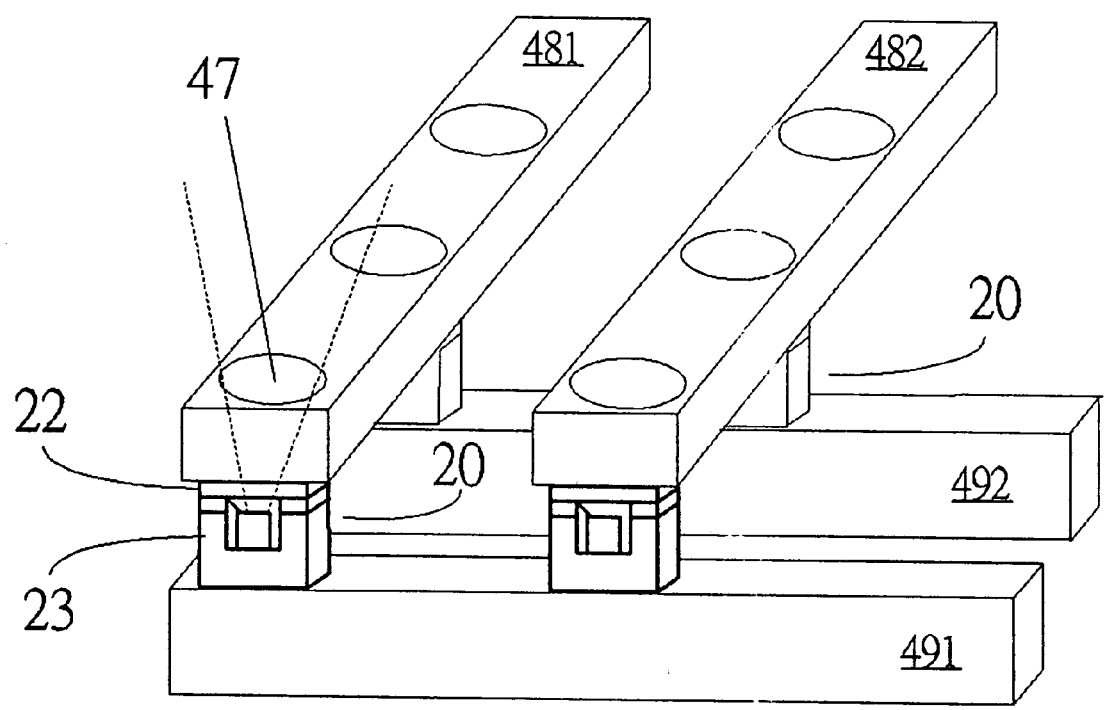
FIG. 10 shows a matrix array of LED packages with lower terminals in the same row resting on one common bed of multiple parallel rows of common beds, and with upper terminals of the LED packages pressed by one common pressure plate of multiple parallel columns of common pressure plates. Each LED package can then be randomly accessed.

FIG. 10 shows a third embodiment of the LED module serving a display panel. An array of LED packages 20 are arranged in a matrix at the cross points along parallel horizontal beds 491, 492, etc. and parallel vertical top pressure bars 481, 482, etc. The bottom terminals 23 of the LED packages 20 rest on the horizontal beds, and the upper terminals 22 of the LED packages 20 are pressed under the vertical top pressure bars. These top bars have windows 47 for light from the LED packages 20 to pass. The pressure of the vertical top bars clamps the LED packages in position and makes firm solderless electrical contacts between upper terminals 22 and the vertical bars 481, 482. By coincident addressing, individual LED packages can be accessed and energized.

Figure 11:
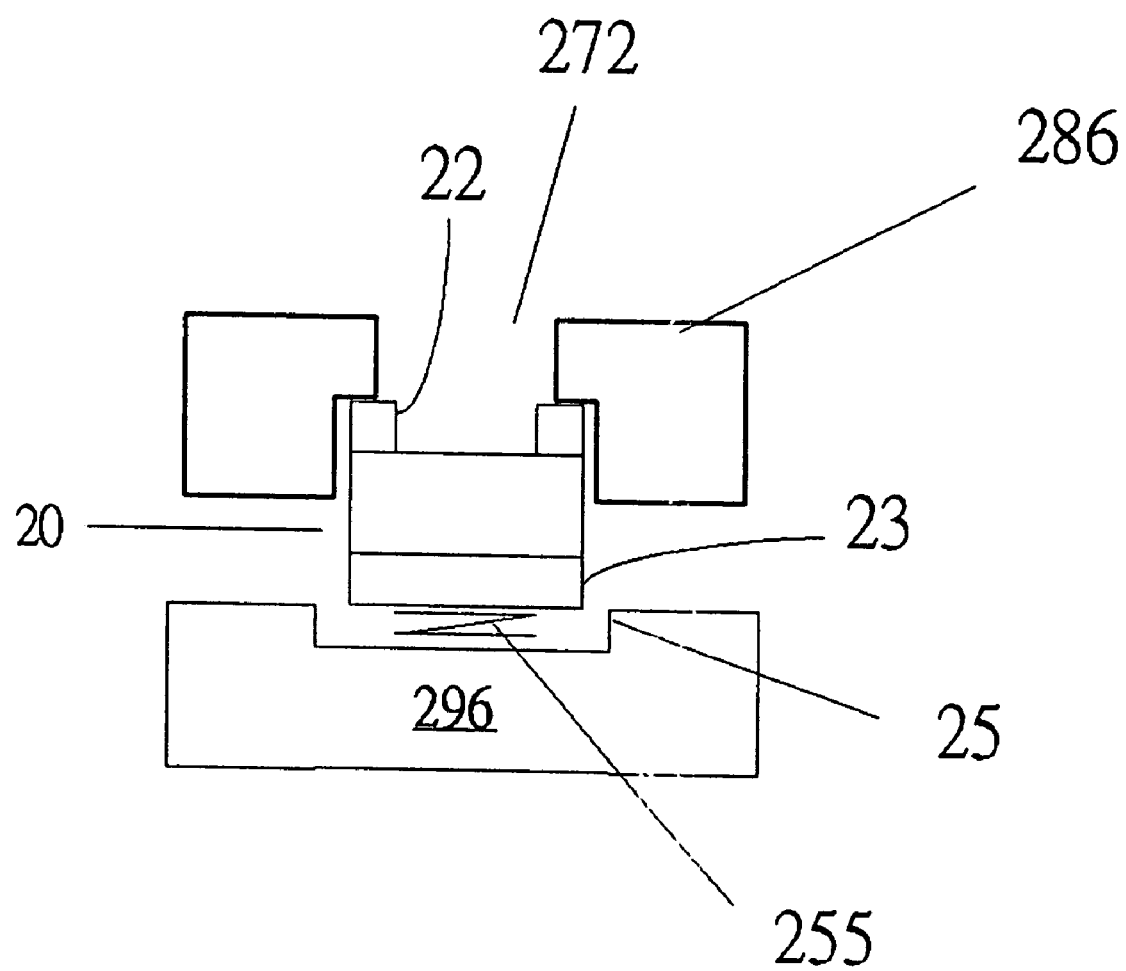
FIG. 11 shows an LED package with a spring inserted between the bottom electrode and the lower terminal to increase pressure at the contacts.

FIG. 11 shows another embodiment of the LED module 20. The structure is similar to that shown in FIG. 4B, with top electrode 22 of the LED, a bottom electrode 23, a upper terminal 286, and a lower terminal 296 with a recess 25. A spring 255 is inserted between the bottom electrode of the LED and the recess 25. The spring 25 pushes the top electrode of LED against the upper terminal 286 to make a solderless pressure contact, and also pushes against the bottom electrode 23 of the LED to make solderless pressure contact. The insertion of the spring 255 increases the pressure at the contacts.

While the preferred embodiments of the invention have been described, it will be apparent to those skilled in the art that various modifications can be made to the embodiments without departing from the spirit of the present invention. Such modifications are all within the scope of this invention.

The invention claimed is:

1. A module for light emitting diode (LED) packages to effect solderless contacts between LED electrodes and LED package terminals, comprising:
    a light emitting diode (LED) having a bottom electrode, and a top electrode;
    an LED package for mounting said LED having a lower terminal on which said bottom electrode rests, and an upper terminal having a connection to said top electrode and insulated from said lower terminal;
    a metal bed on which said lower terminal lies; and
    a pressure plate to sandwich said LED package over said metal bed to effect solderless pressure electrical contacts,
    said pressure plate having a window for light transmission from said LED package, wherein said window is smaller than the top surface of said LED package so that the shoulder of the window rests against said LED package.

2. The module as described in claim 1, wherein said connection is a metal strip.

3. The module as described in claim 1, wherein said connection is a wire.

4. The module as described in claim 1, wherein said metal bed has a recess to anchor said LED package.

5. The module as described in claim 1, further comprising four telescopic posts to support said pressure plate over said metal bad, wherein said pressure plate slides along said posts to clamp said LED package against said metal bed.

6. The module as described in claim 1, wherein said pressure plate is an insulating material and is coated at the bottom surface with conductive material.

7. The module as described in claim 1, further comprising more than one module arranged as a matrix array display panel, wherein more than one said lower terminal of an LED package are mounted along one common metal bed of a plurality of parallel horizontal said metal bed, more than one said upper terminal of an LED package are pressed under one common pressure plate of a plurality of parallel vertical pressure plates, and each said LED at the cross-point of said common metal bed and said common pressure plate can be energized coincidentally from one of said parallel horizontal beds and one of said parallel vertical pressure plates.

8. The module as described in claim 4, further comprising a spring inserted between said bottom electrode and said recess.

9. The module as described in claim 1, wherein said pressure plate is a metal plate.

* * * * *